(12) United States Patent
Zhang et al.

(10) Patent No.: US 6,194,740 B1
(45) Date of Patent: Feb. 27, 2001

(54) OPTICAL SENSOR

(75) Inventors: Hongyong Zhang; Masayuki Sakakura, both of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/115,840

(22) Filed: Jul. 15, 1998

(30) Foreign Application Priority Data

Jul. 16, 1997 (JP) .................................................... 9-207178

(51) Int. Cl.[7] ............................. H01L 29/04; H01L 31/20; H01L 31/036; H01L 31/0376
(52) U.S. Cl. ........................... 257/59; 257/72; 257/291; 257/292; 438/96; 438/97
(58) Field of Search .................................. 257/292, 291, 257/59, 72; 438/97, 96

(56) References Cited

U.S. PATENT DOCUMENTS

| | | | |
|---|---|---|---|
| 4,797,108 | * | 1/1989 | Crowther ................................. 437/41 |
| 5,731,600 | * | 3/1998 | Codama et al. ......................... 257/59 |
| 5,864,150 | * | 1/1999 | Lin ........................................... 257/61 |
| 5,959,312 | * | 9/1999 | Tsai et al. ............................... 257/57 |
| 5,990,492 | * | 11/1999 | Kim ......................................... 257/59 |

FOREIGN PATENT DOCUMENTS

| | | | |
|---|---|---|---|
| 360088462 | * | 5/1985 | (JP) . |
| 362203378 | * | 9/1987 | (JP) . |
| 3622286282 | * | 12/1987 | (JP) . |
| 403046374 | * | 2/1991 | (JP) . |
| 403194937 | * | 8/1991 | (JP) . |
| 403196675 | * | 8/1991 | (JP) . |

* cited by examiner

*Primary Examiner*—William Mintel
(74) *Attorney, Agent, or Firm*—Eric J. Robinson; Nixon Peabody LLP

(57) ABSTRACT

Disposing the light absorption layer formed in contact with a polycrystal silicon layer of a bottom gate type polycrystal silicon TFT allows a depletion layer formed between drain and channel forming regions to extend further into the inside of the light absorption layer, resulting in collection of photo carriers produced in the depletion layer into the channel forming region. The photo carriers collected into the channel forming region are subsequently collected into the source region to be output as large photocurrents by high mobility of the polycrystal silicon.

12 Claims, 4 Drawing Sheets

Fig. 5A
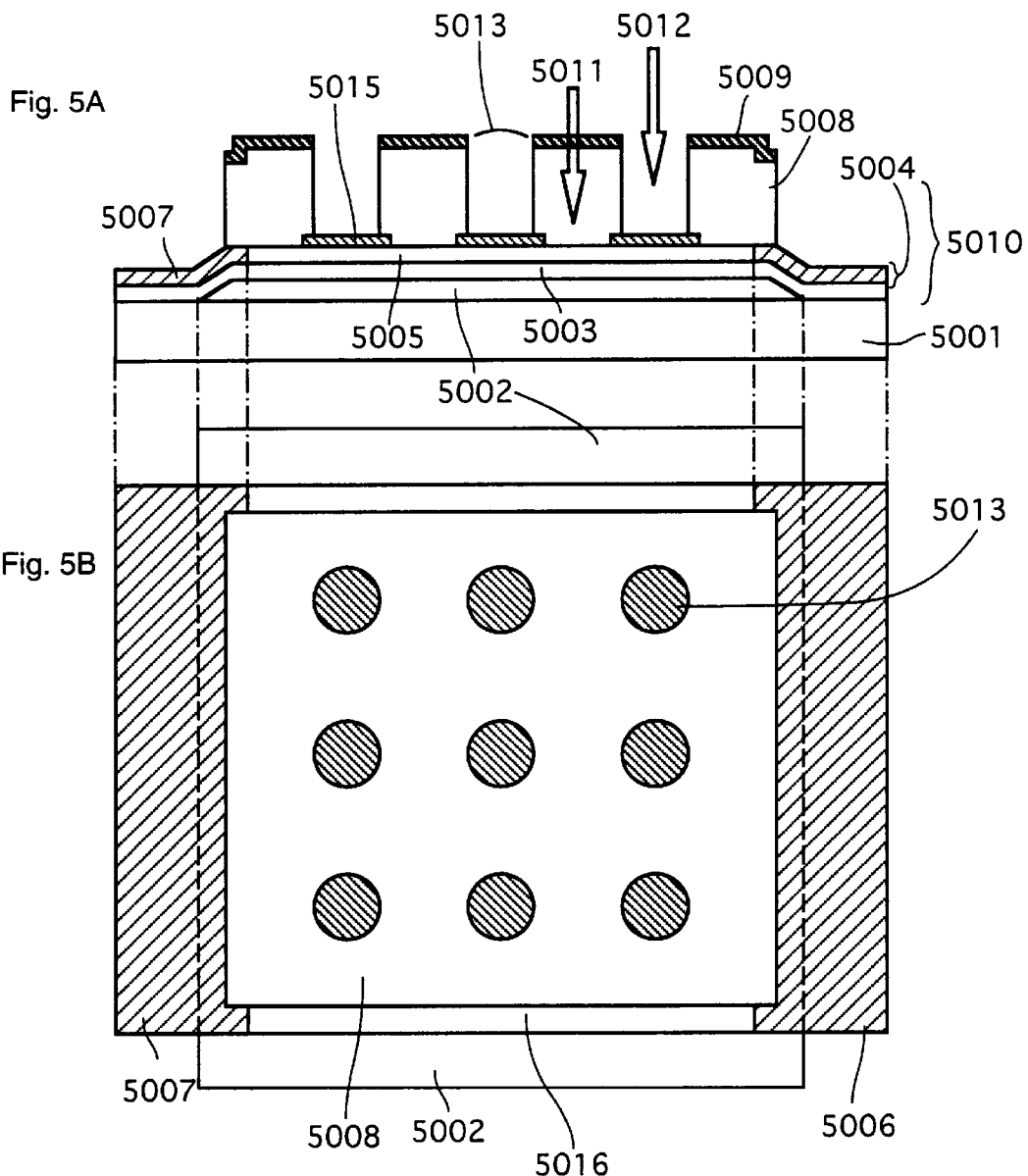
Fig. 5B
Fig. 5C
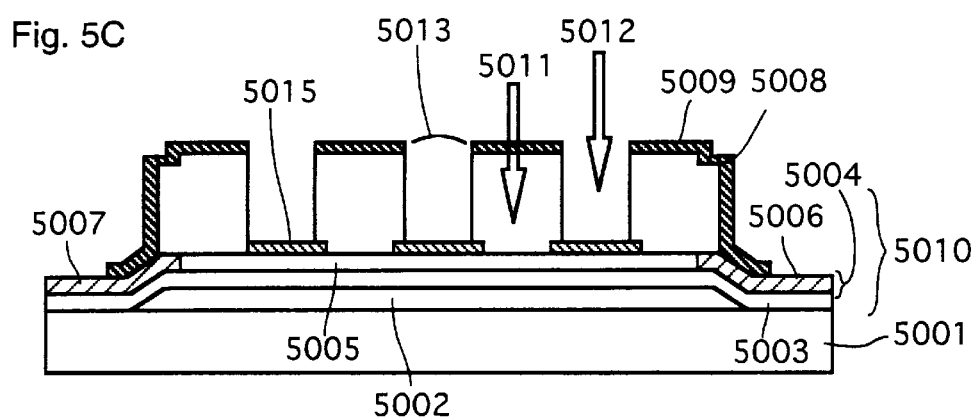

OPTICAL SENSOR

BACKGROUND OF THE INVENTION

1. Field of the Invention

The present invention relates to an optical sensor comprising an amorphous silicon layer with a greater light absorption coefficient for visible light to produce photo carriers for use as a photo current to be transmitted via highly mobile polycrystal silicon. More specifically, the present invention relates to an optical sensor comprising an amorphous silicon layer formed to bring into contact with a channel forming region of a bottom gate-type polycrystal silicon thin film transistor.

2. Description of the Related Art

Optical sensors are commonly used as linear image sensors or area image sensors that convert images produced by facsimiles, copiers, video cameras, digital still cameras, and the like into electrical signals. As materials for optical sensors single crystal silicon, or an amorphous silicon layer are employed. However, except in extraordinary cases, since images produced in a wavelength range of visible light are converted into electrical signals in most cases, the amorphous silicon layer with a greater light absorption coefficient for visible light is commonly used.

Optical sensors using amorphous silicon are divided into two major types: 1) a resistance-type and 2) a diode-type. In the resistance type, a greater current can be obtained due to amplification action as a transistor. However, since it produces carriers in large quantities by amplification, annihilation or collection of the amplified carriers are virtually impossible even after the light is interrupted, which results in a slower light response rate and narrower dynamic range controlled by the intensity of light. In the diode type, there is a feature that a depletion layer spreads widely in the amorphous silicon, thereby allowing the photo carriers produced upon the incidence of light to be easily collected, and a faster light response rate due to the lack of amplification action and a wider dynamic range controlled by the intensity of light are obtained. However, because the current is small in the diode-type, a capacitor is required for retaining electric charges.

A switch to output signals detected by an optical sensor as an output signal with time-division has a bare IC-type that utilizes a field effect transistor of a single crystal semiconductor (mainly, silicon semiconductor) as an analog switch. Analog switches include TFT-types using a thin film transistor that employs amorphous silicon or polycrystal silicon for a channel forming region.

The IC types have a faster switching rate and a greater performance reliability but require as many analog switches as optical sensors as the bare IC chip, resulting in high cost switch applications. At the same time, since both a thin film substrate used to form a light absorption layer (optical sensor portion) such as amorphous silicon and the bare IC chip are required, the area thereof becomes wider, thereby being an obstacle of a size reduction. The TFT-types utilize thin films for forming the switches to allow both the optical absorption layer such as amorphous silicon and a TFT for use as a switch to be formed on the same substrate, thereby being capable of easily reducing the area and downsizing, and drastically cutting the costs compared to the IC-types. Among the TFT-types, thin film transistors using amorphous silicon for the channel forming region (amorphous silicon TFTs) utilize the amorphous silicon TFTs also for forming the switch element when, for example, the optical sensor portion is formed of amorphous silicon, resulting in lower cost than when utilizing polycrystal silicon TFTs due to sharing of the fabrication process. However, a faster switching rate is impossible due to the mobility of the amorphous silicon as small as 1 $cm^2$/Vsec. For that reason, amorphous silicon is not applicable for an area sensor where area elements are increased in number, and for a linear sensor capable of dealing with high-speed.

Among the TFT-types, thin film transistors using the polycrystal silicon for forming the channel forming region (polycrystal silicon TFTs) require the formation of polycrystal silicon in addition to the formation of the light absorption layer such as amorphous silicon, resulting in more fabrication processes than in the case where the amorphous silicon TFTs are used. However, since the mobility of the polycrystal silicon is as great as 10 to 200 $cm^2$/Vsec, a faster switching rate is possible. For that reason, an image sensor comprising the optical sensor element formed by the amorphous silicon and the switch element formed by the polycrystal silicon TFT is effective.

Most image sensors comprising the optical sensor element formed by amorphous silicon and the switch element formed by polycrystal silicon combine a diode type optical sensor utilizing the amorphous silicon and polycrystal silicon TFT for use as separate devices. The reason is that the use of the resistance-type optical sensor results in a reduced response rate, thereby making full use of the high-speed switching capabilities of the polycrystal silicon TFT impossible.

In most cases, either a 1) p-i-n diode or 2) Schottky diode is used for forming the diode-type amorphous silicon optical sensor element. The p-i-n diode forms a triple electro conductive layer of the p, i, and n types, where a depletion layer extends in the i-type amorphous silicon region, to thereby allow electrons to be transmitted into the n-type region and holes into the p-type region, with almost no recombination of the photo carriers produced therein.

The p-i-n diode-type structurally requires either the p-type or the n-type, utilizing silicon carbide (SiC), microcrystal silicon ($\mu$c-Si), silicon nitride (SiN), and the like. The p-type and n-type layers require binary to quadrinary reaction gases, making the entire fabrication process complicated.

The Schottky diode-type forms a Schottky barrier by putting the amorphous silicon in contact with non-ohmic contact type conductive materials at the position thereof to use the resulting depletion layer formed in the Schottky barrier. The Schottky barrier is formed by simply forming a conductive film, which is much easier than the p-i-n diode-type. However, the depletion layer is formed in a narrower area compared to the p-i-n diode-type, making full collection of produced photo carriers difficult. A thinner amorphous silicon layer is required to collect all the photo carriers produced but has to tolerate smaller photo carrier quantities produced due to inferior optical absorption performance, resulting in lower photosensitivity for an optical sensor. A thicker amorphous silicon layer to increase optical absorption performance prevents the depletion layer from extending in the entire amorphous silicon and generates a resistance portion inside. That makes impossible to collect the produced photo carriers to recombine the same.

Either the p-i-n diode-type or the Schottky diode-type delivers a greater light absorption coefficient in shorter wavelengths of 450 nm and below when absorbing visible light to produce photo carriers, which causes the light to be absorbed before it reaches the depletion layer of the diode. This triggers recombination of the photo carriers produced by shorter wavelengths before reaching the depletion layer, resulting in no electrical signal outputs, which indicates weak sensitivity of blue color of an optical sensor.

In either of the Schottky diode-type or the p-i-n diode-type, the optical sensor element formed of the amorphous silicon and the polycrystal silicon TFT portion are formed in different locations. Therefore, upon the fabrication of the area sensor, the sensor portion and the TFT portion are formed in a single element. As a result, the region area of the light absorption element such as amorphous silicon and the like, which actually absorbs light, is reduced, making large-volume optoelectrical signal receptions difficult.

SUMMARY OF THE INVENTION

The present invention has been made in view of the above, and the present invention provides an entirely novel structure with a higher level of photosensitivity and operation rate by skillfully combining excellent absorption performance of amorphous silicon and high mobility of polycrystal silicon.

In other words, in an optical sensor according to the present invention, a photodetector portion using an amorphous silicon layer is arranged in contact with the upper portion of a polycrystal silicon TFT, a depletion layer at the source or drain portion of the polycrystal silicon TFT is extended to the interior of the amorphous silicon layer, and photocarriers produced by absorption by the amorphous silicon layer are possible to be swiftly transmitted to polycrystal silicon.

An object of the present invention is to provide an entirely novel optical sensor by combining excellent properties of the two materials, i.e., photosensitivity for visible radiation of amorphous silicon and high mobility of polycrystal silicon.

In addition, the light in short wavelength region easily realized a structure in which the photo carriers are produced not in the amorphous silicon layer but directly in a channel forming region of the polycrystal silicon. Therefore, the present invention has another object to provide a highly sensitive optical sensor to cover all of the visible radiation ranges of blue, green, and red.

DETAILED DESCRIPTION OF THE INVENTION

Detailed description is made of means to achieve the above objects. Adjusting a gate voltage, included in the structure of a polycrystal silicon TFT, allows variations in field effect mobility especially in a channel forming region. For example, in a case of NMOS, the mobility becomes greater and the switch enters the ON state when positively charging the gate voltage. In reverse, the mobility becomes lower and the switch enters the OFF state when lowering or negatively charging the gate voltage.

This also applies to a case of PMOS by reversing positive and negative of the gate voltage. Forming an amorphous silicon layer in contact with the channel forming region allows photo carriers produced therein to be transmitted into the polycrystal silicon TFT when the switch is in the ON state.

To flow a current between a source and drain requires application of a drain voltage in addition to the gate voltage. When the drain voltage is applied, a depletion layer is formed between the drain and channel. The state in which the depletion layer extends into the source is called 'punchthrough', whereby the current keeps on passing independently of the gate voltage, thereby requiring the drain voltage to be applied to an extent that the punchthrough is not formed.

The amorphous silicon layer is formed in contact with the drain and channel forming region. The depletion layer is formed between the drain and channel forming region. Since the amorphous silicon is in contact with the drain and channel formation region, the depletion layer can be formed from the drain through the inside of the amorphous silicon layer. The amorphous silicon layer allows the depletion layer extending from the drain to be formed therein when the drain voltage is applied, to transmit photocarriers produced in the amorphous silicon layer to the channel forming region immediately after the production by the depletion layer.

Processing amorphous silicon with the solid phase growth method to make it polycrystalline forms the polycrystal silicon. The amorphous silicon layer as a photodetector should be formed after the solid phase growth. If the amorphous silicon is formed before the solid phase growth, it is crystallized during the solid phase growth of the polysilicon film, or although crystallization may be avoided, hydrogen flows out of the amorphous silicon in large quantities, resulting in the amorphous silicon formed with dangling bonds in large quantities. This leads to traps of photo carriers by the dangling bonds, making photodetecting impossible.

A top gate type TFT comprises polycrystal silicon, a gate insulating film, and a gate electrode formed on a substrate in bottom-to-top sequence from the substrate according to the order. In this case, since the channel region is formed below the gate, it is impossible to make the amorphous silicon film in contact with the channel region. In order to have the amorphous silicon layer contact with a drain region, since the amorphous silicon layer cannot be formed on the upper portion of the TFT, it needs to be formed between the TFT and the substrate. However, amorphous silicon needs to be formed prior to formation of polycrystal silicon, making the formation of amorphous silicon layer capable of photodetecting virtually impossible, as described above.

To solve the problem, the present invention employs a bottom gate type TFT comprising a gate electrode, a gate insulating film, and polycrystal silicon formed on the substrate in bottom-to-top sequence from the substrate according to the order to form the amorphous silicon layer on the polycrystal silicon. This structure is free of the problem described above as the amorphous silicon layer is formed after formation of the polycrystal silicon TFT. In the polycrystal silicon layer, the channel forming region is formed over the gate electrode, sandwiched between the source and drain regions. Forming amorphous silicon on top of the polycrystal silicon layer thereby allows the amorphous silicon layer to easily come in contact with the channel formation region and the drain region of the polycrystal TFT.

Forming the amorphous silicon layer in contact with both the drain and channel forming regions allows the depletion layer formed between the drain and channel to extend further to the inside of the amorphous silicon layer. Photo carriers produced in the depletion layer are smoothly collected into the channel forming region.

In a case of the bottom gate type TFT, the amorphous silicon layer formed in contact with the TFT is not in contact with the channel itself in actuality. The channel is formed on the gate insulating film and polycrystal silicon interface. The TFT, however, comprises the polycrystal silicon layer as thin as 100 to 1500 Å approximately, resulting in the depletion layer formed in the entire region of the polycrystal silicon layer in a vector perpendicular to the polycrystal silicon layer from the gate electrode when applying a gate voltage. Photo carriers produced in the channel and amorphous silicon layer in contact with the polycrystal silicon layer opposite the channel reach the channel forming region (i.e. the polycrystal silicon layer in which the channel is formed, but is not channel itself) and then reach the channel along the resulting depletion layer.

In addition, by forming a transparent conductive film on the amorphous silicon layer to apply a voltage between the transparent conductive film and the source region, effective collection of photo carriers is obtained. Coupling the transparent conductive film which is transparent to visible radiation to the drain allows a simple structure in which a drain voltage can be applied also between the transparent conductive film and source. Further, the contact between the transparent conductive film and the amorphous silicon becomes a Schottky junction, thereby forming a depletion layer by the resulting Schottky barrier. The depletion layer extending from the drain region to the inside of the amorphous silicon layer, an electric field induced between the transparent conductive film and the source, and the depletion layer by the Schottky barrier cause collection of photo carriers in the channel forming region. The channel substantially acts like conductor when a gate voltage is applied and the TFT is in the ON state, resulting in electrical fields produced not only between the transparent conductive film and source but also between the transparent conductive film and channel, to collect photo carriers in the channel forming region effectively.

When forming no transparent conductive film, the amorphous silicon layer is covered with an insulating film transparent to visible radiation in order to avoid degradation of the amorphous silicon layer. In this case, photo carriers produced by the light absorbed in the depletion layer extending from the drain region to the inside of the amorphous silicon layer and dispersed photo carriers produced by the light absorbed outside the depletion layer are collected in the channel forming region.

The amorphous silicon layer has dark resistivity of $1\times10^{10}$ $\Omega$cm and more delivering relatively great resistivity to the dark resistivity of polycrystal silicon of $10^6$ $\Omega$cm (by triple digits and more). This prevents a leak current from passing via the amorphous silicon layer when the polycrystal silicon TFT is in the OFF state.

There are problems associated with amorphous silicon layer light absorption of visible radiation having shorter wavelengths (450 nm and less). The amorphous silicon layer delivers a greater absorption coefficient for light of shorter wavelengths, resulting in absorption of almost all incoming light by the amorphous silicon layer before the light reaches the depletion layer extending from the drain. Though the absorbed light subsequently produces photo carriers, not all of the photo carriers reach the depletion layer. Many of the carriers recombine before reaching the depletion layer, only to lower photosensitivity.

Having as much light of shorter wavelengths as possible absorbed either in the channel or near the channel forming region of the polycrystal silicon TFT allows produced photo carriers efficiently to be transmitted into the channel. A structure in which the amorphous silicon layer is not formed in a part of the channel forming region of the polycrystal silicon TFT allows efficient absorption of light having either longer or shorter wavelengths. The amorphous silicon layer is formed in contact with a part of the drain region and a part of the channel forming region, allowing a depletion layer formed in the drain to extend further to the inside of the amorphous silicon layer, and photo carriers produced therein to be collected into the channel. At the same time, light is directly irradiated into the part of channel forming region out of contact with the amorphous silicon layer. (via an etch stopper film with a wide energy gap in actuality).

The polycrystal silicon has a thickness of 100 to 1500 Å approximately for a film to form a thin film transistor and also for reducing OFF-state currents. The layer is thick enough to absorb light of shorter wavelengths, and the light of shorter wavelengths absorbed in the channel forming region is instantaneously collected into the source through the channel.

Implementation of an optical sensor with a high level of photosensitivity for all of the light of the visible radiation regions from shorter to longer wavelengths of 300–800 nm approximately is applicable by disposing the channel forming region out of contact with the amorphous silicon layer.

BRIEF DESCRIPTION OF THE DRAWINGS

In accompanying drawings:

FIGS. 5A to 5C show another embodiment according to the present invention.

DETAILED DESCRIPTION OF THE PREFERRED EMBODIMENTS

An optical sensor according to the present invention will be hereinafter described with reference to embodiments as follows.

Embodiment 1

Figure 1A:
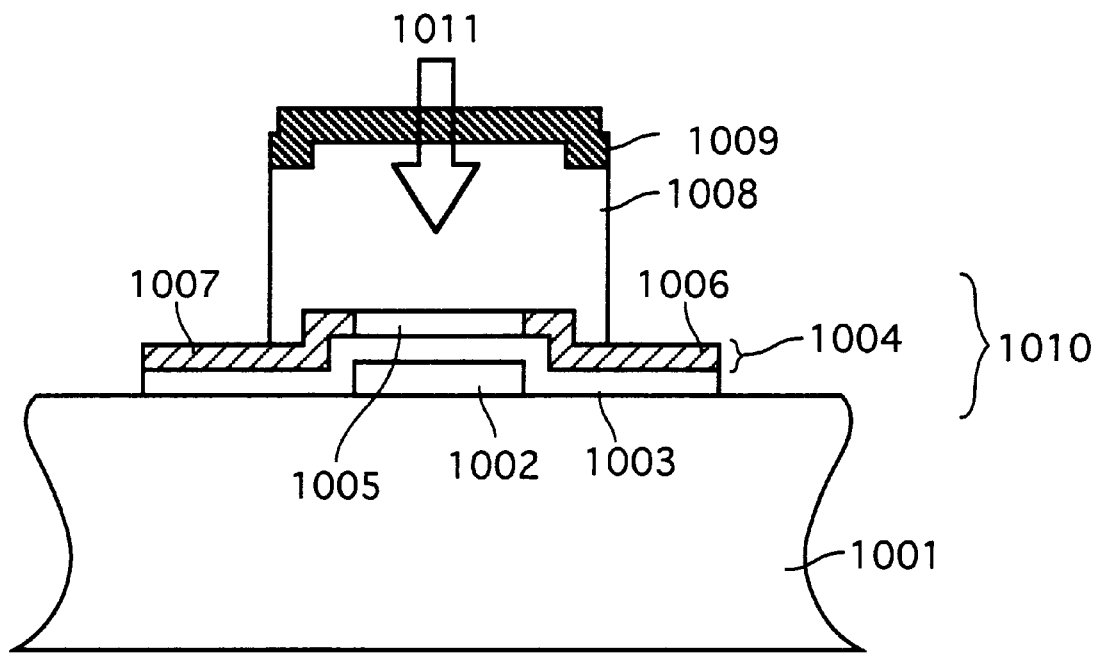
FIGS. 1A and 1B show an embodiment according to the present invention.

FIG. 1A shows a first embodiment of the present invention. The present embodiment utilizes a quartz substrate as a substrate 1001. The substrate may be made of any materials as long as the substrate has thermal resistivity of temperatures required for forming polycrystal silicon thereafter. Sapphire, ceramics or the like can be used as the substrate. Light absorbed by an optical sensor is irradiated from the opposite side of the substrate 1001, thereby allowing the substrate 1001 to be formed either transparent or opaque, according to an actual application.

A gate electrode 1002 is formed on the substrate 1001. An under film is formed between the substrate 1001 and gate electrode 1002 if necessary. No under film is formed for the present embodiment due to the quartz substrate for use as the substrate 1001. In case that borosilicate glass, sodium glass, soda glass, ceramics, and the like is used as the substrate, or a single crystal semiconductor substrate is used, instead of quartz the film needs to be formed between the substrate 1001 and gate electrode 1002. Any type of material is applicable for use as the gate electrode 1002, as long as the material has conductivity. However, material with thermal resistivity of temperatures required for forming polycrystal silicon thereafter is needed, for which reason inventors of the present invention chose to utilize chromium, aluminum or tantalum, the latter two of which are preprocessed with the anode oxidation method. Typically, tantalum preprocessed with the anode oxidation method is utilized for the gate electrode 1002. A gate insulating film 1003 is formed on the gate electrode 1002. Either single or multi layers of silicon oxide or silicon nitride can be utilized for the gate insulating film 1003. However, a silicon oxide film is more preferable than a silicon nitride film as material that is in contact with the polycrystal silicon, due to its wider energy gap. The inventors of the present invention utilize a single-layer silicon oxide film for the gate insulating film 1003.

A polycrystal silicon layer 1004 is formed on the gate insulating film 1003. Forming the polycrystal silicon layer by processing preformed amorphous silicon with either thermal treatment or strong light such as a laser, lamp, and the like rather than directly forming polycrystal silicon results in a larger grain size, higher mobility, and better semiconductor properties. The inventors of the present invention form the polycrystal silicon layer 1004 by first forming amorphous silicon and having the resulting amorphous silicon crystallized with a KrF excimer laser. The polycrystal silicon layer 1004 has a film thickness of 100 to 1500 Å approximately. The polycrystal silicon layer 1004 of the present embodiment has a film thickness of 400 Å.

The polycrystal silicon layer 1004 further comprises a channel forming region 1005, a drain region 1006, and a source region 1007. A polycrystal silicon thin film transistor (TFT) 1010 is formed by the polycrystal silicon layer 1004 comprising the gate electrode 1002, the gate insulator film 1003, the channel forming region 1005, the drain region 1006, and the source region 1007.

It works effectively for the polycrystal silicon TFT 1010 to form an OFF-set region free of dopant or a lightly doped region (LDD) between the drain and channel forming regions, or between the source and channel forming regions, or both, to reduce polycrystal silicon TFT OFF-state currents.

An amorphous silicon layer 1008 is formed on the polycrystal silicon layer 1004. The amorphous silicon layer 1008 is in contact with the channel forming region 1005, the drain region 1006, and the source region 1007. In particular, the amorphous silicon layer is formed in contact with almost the entire region of the channel forming region 1005. For amorphous silicon layer 1008 properties, it has intrinsic or substantially intrinsic conductivity, thereby allowing a depletion layer to extend further to the inside of the amorphous silicon.

A Fermi level is not necessarily located at the band gap center when forming amorphous silicon. Rather, the Fermi level shifts in a direction to form a pseudo n-type semiconductor despite no doping due to its structural problem. When the amorphous silicon is doped with p-type dopnats such as boron of 3 Group and the like at $5 \times 10^{16}$ to $1 \times 10^{18}$ cm$^{-3}$, the Fermi level can be set at the band center. The resulting amorphous silicon layer, although doped with dopants, since the location of the Fermi level is closer to an intrinsic state than that of the non-dope silicon, is considered as a substantially intrinsic state.

A transparent conductive film 1009 is formed on the amorphous silicon layer 1008. Indium tin oxide (ITO), tin oxide, and the like may be used for the film 1009. The transparent conductive film 1009 is used for application of a voltage between the source region 1007 and the film. In the present embodiment, the transparent conductive film 1009 utilizes ITO. ITO having a thickness of 1000 to 2000 Å is used considering its transmission ratio and electrical resistance value. Typically, ITO with a thickness of 1200 Å is used. ITO is material to form a Schottky junction by coupling to the amorphous silicon layer, which results in a depletion layer formed from the junction surface through the inside of the amorphous silicon layer as deep as 1000 to 3000 Å approximately by the schottky barrier.

Incident light 1011 irradiated into the amorphous silicon layer 1008 through the transparent conductive film 1009 is absorbed in the amorphous silicon layer 1008 to produce photo carriers. In detail, the photo carrier is generated by a pair of an electron and a hole. The resulting photo carriers are subsequently dispersed in various directions in random manner when neither field effects nor depletion layer exist in the amorphous silicon layer 1008. Recombination of the electrons and holes annihilate the dispersed photo carriers. Photo carriers collected outside prior to recombination are converted into currents.

When the polycrystal silicon TFT 1010 is a n-type transistor, so-called NMOS, the source region 1007 and the drain region 1006 are phosphorus-doped. A channel is formed by the accumulation of electrons at the channel forming region 1005 when applying a positive voltage larger than a threshold voltage to the gate electrode 1002. The channel is formed in the channel forming region 1005 that is an interface of the gate insulating film 1003 and the polycrystal silicon layer 1004, and is upper portion of the gate electrode 1002.

When the polycrystal silicon TFT 1010 is in the OFF state, photo carriers are annihilated, accompanying no collection into the source region, when reaching the channel forming region by dispersion due to no channel formed.

When the polycrystal silicon TFT 1010 is in the ON state, however, the entire channel forming region 1005 formed over the upper area of the gate electrode 1002 is depleted due to the applied gate voltage, unlike a bulk semiconductor. This allows the photo carriers dispersed in the forming region 1005 to reach as far as the channel.

Further, the depletion layer is formed between the drain and channel due to the applied drain voltage, extending further to the inside of the amorphous silicon layer 1008. This allows the photo carriers produced in the depletion layer to be collected into the channel forming region 1005 and eventually into the source region through the channel when the polycrystal silicon TFT is in the ON state.

A voltage is applied between the transparent conductive film 1009 and the source region 1007, resulting in collection of the photo carriers by an electric field produced by the voltage applied to the transparent conductive film 1009, as well as by the depletion layer formed from the drain region 1006 through the inside of the amorphous silicon layer 1008. When the photo carriers are produced in huge quantities in the amorphous silicon layer 1008, it works effectively to apply drain voltage to a Schottky barrier formed between the transparent conductive film 1009 and the amorphous silicon layer 1008 to generate inverse bias to prevent a current from passing between the transparent conductive film 1009 and source region 1007, when the TFT is in the OFF state.

Embodiment 2

Figure 1B:
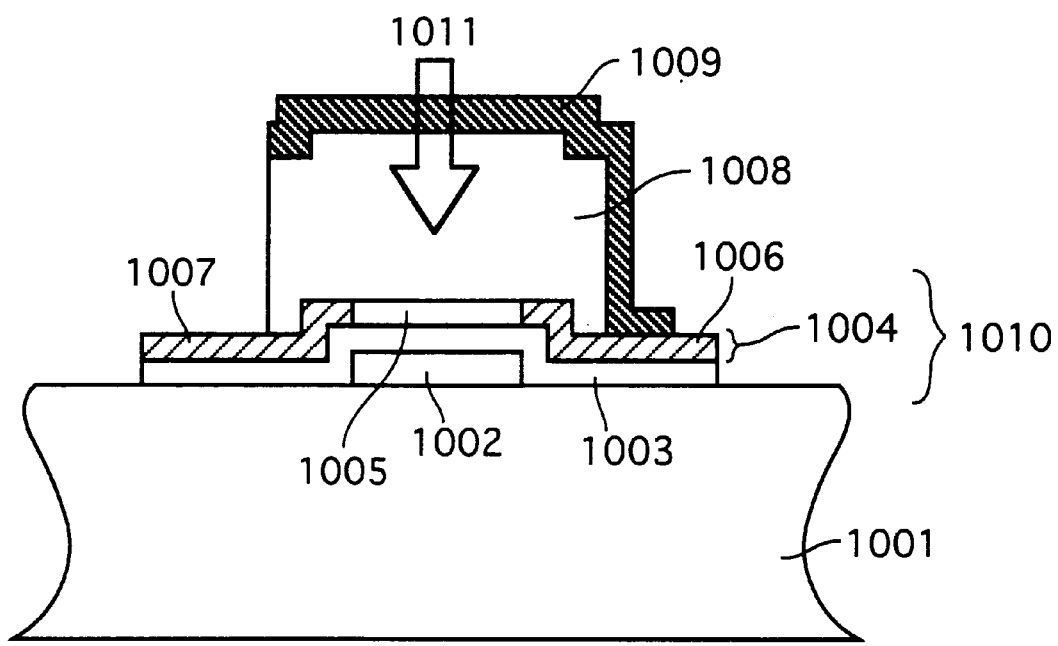

FIG. 1B shows a second embodiment of the present invention where the transparent conductive film 1009 is coupled with the drain region 1006, and reference numerals of FIG. 1B are identical to that of FIG. 1A. This structure allows drain voltage to be automatically applied between the transparent conductive film 1009 and the source region 1007, resulting in a simplified optical sensor structure requiring no additional application of a voltage to the transparent conductive film 1009.

Embodiment 3

A third embodiment of the present invention using a transparent insulating layer 1009 instead of the transparent conductive film 1009 of the first embodiment of the present invention shown in FIG. 1A will be described. Basically, every other detail is identical to that of the first embodiment of the present invention, except for the use of the transparent insulating layer 1009 instead of the transparent conductive film 1009.

In the present embodiment, either photo carriers produced by the light absorbed in the amorphous silicon layer 1008 reach the channel forming region by dispersion, or photo carriers produced by the light absorbed in the depletion layer extending from the drain region 1006 further into the inside of the amorphous silicon layer 1008 are collected. In principle, the optical sensor functions sufficiently without the transparent insulating layer 1009, which is required, however, to avoid amorphous silicon layer 1008 degradation. Materials for the transparent insulating film 1009 include silicon oxide, silicon nitride, silicon oxynitride, phosphosilicate glass (PSG), and the like. The present embodiment utilizes PSG.

Embodiment 4

Figure 2A:
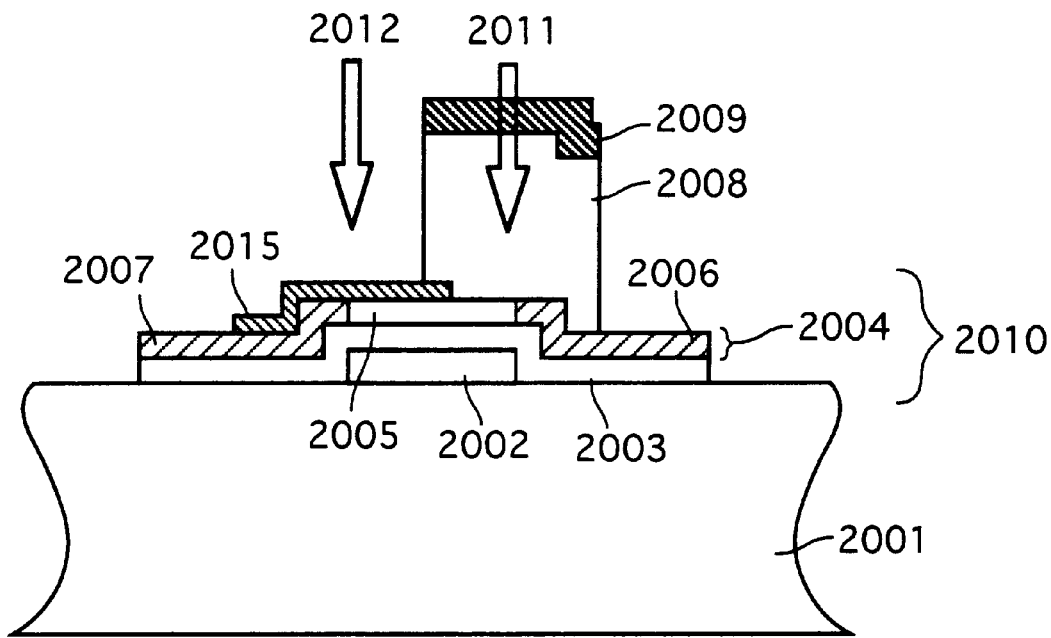
FIGS. 2A and 2B show another embodiment according to the present invention.
Figure 2B:
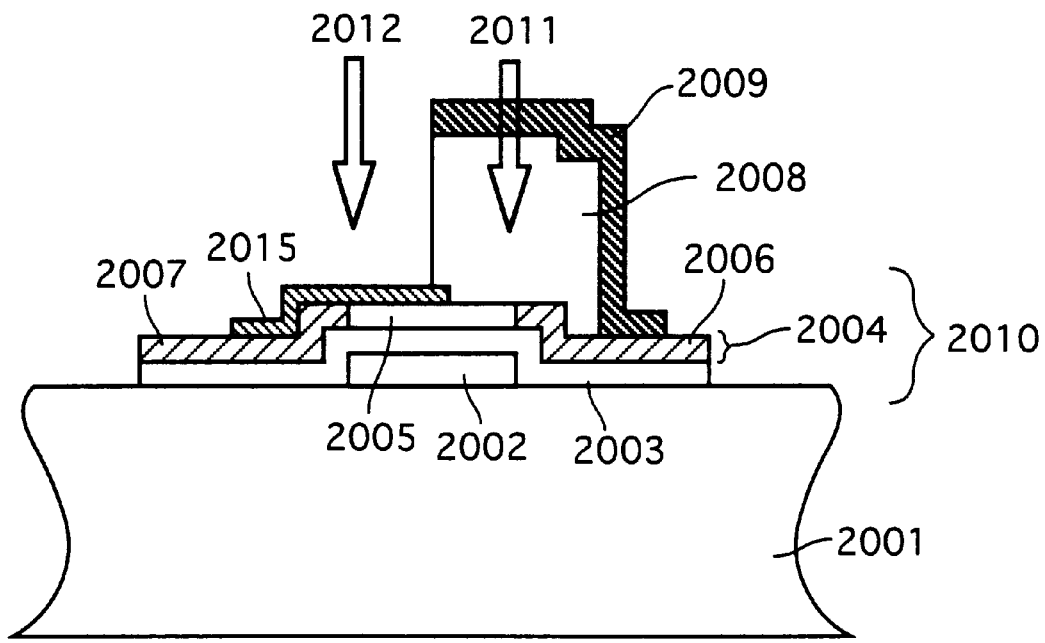

FIG. 2A shows a fourth embodiment according to the present invention. Notations of names and marks of FIGS. 2A and 2B are identical to FIGS. 1A and 1B. In detail, 1001 and 2001, or 1006 and 2006, are identical, and so are the rest. What makes the present embodiment different from the first embodiment is that an amorphous silicon layer 2008 and a transparent conductive film 2009 are not entirely formed over the polycrystal silicon TFT 2010. The amorphous silicon layer 2008 is in contact with a part of a drain region 2006 and a part of a channel forming region 2005, but is not in contact with a source region 2007.

In accordance with the present embodiment, a part of the channel forming region 2005 is not in contact with the amorphous silicon layer 2008. Implementation of this structure requires an etching process of a part of the amorphous silicon layer to have a part of the channel forming region 2005 and source region 2007 exposed, which needs an etch stopper 2015. Insulator materials with the largest possible optical gap are ideal for forming the etch stopper 2015. A silicon oxide film, silicon nitride film, and the like are effective materials for the stopper. In the present embodiment, a silicon nitride film of 500 to 1500 Å in thickness is formed for use as the etch stopper 2015.

The structure of the present embodiment irradiates incident light 2011 through a transparent conductive film 2009 into the amorphous silicon layer 2008, which in turn absorbs the light to produce photo carriers. The resulting photo carriers reach the channel forming region 2005, transmitted by a depletion layer extending from the drain region 2006 further to the inside of the amorphous silicon layer 2008, an electric field applied to the transparent conductive film 2009 and the channel forming region 2005, a depletion layer formed by a Schottky junction between the transparent conductive film 2009 and the amorphous silicon layer 2008, and the like. The photo carriers are subsequently flowed to the channel, and eventually collected into the source region 2007.

In addition, incident light 2012 are irradiated directly into the channel forming region 2005 via the etch stopper 2015. The irradiated light is absorbed therein to produce photo carriers, which are immediately collected into the source region 2007 through the channel. Light having shorter wavelengths is directly absorbed by the polycrystal silicon to achieve superior photosensitivity for light having shorter wavelengths.

Embodiment 5

FIG. 2B shows a fifth embodiment of the present invention where the transparent conductive film 2009 is coupled with the drain region 2006, and the notation of FIG. 2B is identical to FIG. 2A. This structure allows drain voltage to be automatically applied between the transparent conductive film 2009 and source region 2007, resulting in a simplified optical sensor structure requiring no additional application of voltage to the transparent conductive film 2009.

The amorphous silicon layer 2008 is not in contact with the source region 2007, resulting in no accumulation of carriers in the channel to keep effective electrical fields from being applied between the transparent conductive film 2009 and source region 2007, when the polycrystal silicon TFT 2010 is in the OFF state. When the polycrystal silicon TFT 2010 is in the ON state, however, the channel substantially works as conductor having resistance due to accumulation of carriers in the channel. (fundamental principle of a field effect semiconductor device) Drain voltage is thereby effectively applied between the transparent conductive film 2009 and source region 2007 only when the polycrystal silicon layer 2010 is in the ON state.

The photo carriers produced in the amorphous silicon layer 2008 are collected into the channel forming region 2005 by the electrical fields applied between the transparent conductive film 2009 and source region 2007 in addition to the depletion layer extending from the drain region 2006 further to the inside of the amorphous silicon layer 2008, only when the polycrystal silicon layer 2010 is in the ON state. The carriers collected are eventually collected into the source region 2007 through the channel to become optoelectrical signals.

Embodiment 6

FIGS. 5A and 5B show an application of the third embodiment of the present invention. Basic notations of marks of FIGS. 5A and 5B are identical to the third embodiment. In detail, the substrate 2001 and 5001, or and the etch stopper 2015 and 5015, are identical, and so are the rest. In the present embodiment, structure is that an area where an amorphous silicon layer 5008 is formed in contact with a channel forming region 5005 and an area where the channel forming region is in contact with an each stopper 5015 but not in contact with the amorphous silicon layer 5008 are divided into multiple sub-regions. Incident light 5011 is irradiated into the amorphous silicon layer 5008 via a transparent conductive film 5009. The irradiated light is absorbed therein to produce photo carriers. Incident light 5012 is irradiated into the channel forming region 5005 via the etch stopper 5015.

The irradiation light 5011 which is to be absorbed in the amorphous silicon layer 5008 and the light 5012 which is to be absorbed in the channel forming region exist in multiple locations of the channel forming region 5005. The region 5013 is an opening through the amorphous silicon layer 5008.

FIG. 5B is a plain view of FIG. 5A. The top view shows polycrystal silicon formed on the gate electrode 5002 and the amorphous silicon layer 5008 is disposed to partially overlap the source region 5007 and the drain region 5006. The amorphous silicon layer 5008 has a protruding region 5016 that is a part of the channel forming region 5005 of the polycrystal silicon, that is because the area of the amorphous silicon layer 5008 is smaller than that of the polycrystal silicon. The area where by the amorphous silicon layer 5008 does not exist is the region 5013, which has a circular figure in the present embodiment.

However, it is needless to say other figures such as a square, perfect square, lozenge, cross, serve the purpose. The gross area of the region 5013 is balanced with the photosensitivity performance as a whole of an optical sensor. Superior photosensitivity in shorter wavelengths requires a larger gross area of the region 5013 in order to increase the quantities of the incident light 5012 to be directly in the channel forming region 5005 via the etch stopper 5015. When larger quantities of optical currents as a whole is desired rather than larger quantities of shorter wavelengths, the area of the region 5013 is reduced in order to increase the quantities of the incident light 5011 to be absorbed in the amorphous silicon layer 5008 via the transparent conductive film 5009 formed on the amorphous silicon 5008. The first embodiment is the case where the gross area of the region 5013 is reduced to zero in the present embodiment.

Embodiment 7

FIG. 5C shows a seventh embodiment of the present invention in which the transparent conductive film 5009 is coupled with the drain region 5006 and the notation of the figure is identical to FIGS. 5A and 5B. This structure allows a drain voltage to be automatically applied between the transparent conductive film 5009 and the source region 5007 like the embodiments of FIGS. 2A and 2B, resulting in a simplified optical sensor structure requiring no additional application of a voltage to the transparent conductive film 5009.

In this embodiment, the amorphous silicon layer 5008 is not in contact with the source region 5007, resulting in no accumulation of carriers in the channel to keep effective electrical fields from being applied between the transparent conductive film 5009 and the source region 5007, when the polycrystal silicon TFT 5010 is in the OFF state. When the polycrystal silicon TFT 5010 is in the ON state, however, the channel substantially acts as conductor having resistance due to accumulation of carriers in the channel. (fundamental principle of a field effect semiconductor device) Drain voltage is thereby effectively applied between the transparent conductive film 5009 and the source region 5007 only when the polycrystal silicon TFT 5010 is in the ON state.

Embodiment 8

Figure 3:
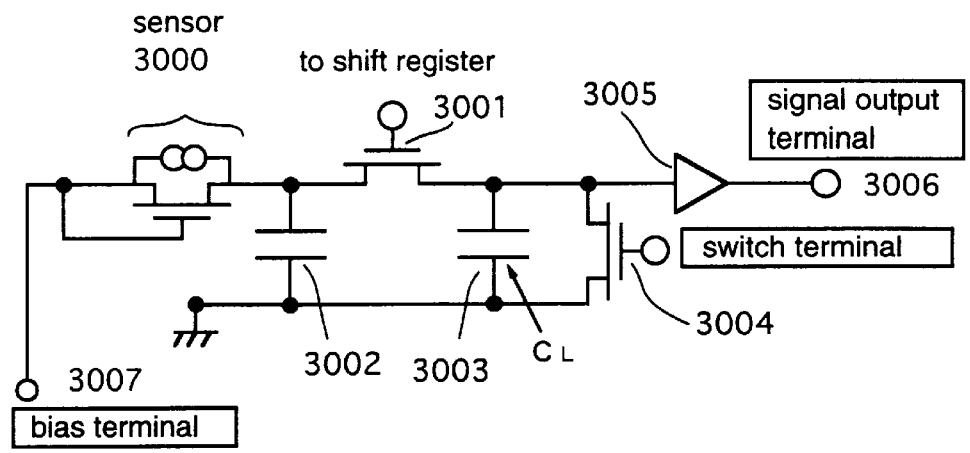
FIG. 3 shows a circuit structure when the present invention is applied to a linear image sensor.

FIG. 3 shows an eighth embodiment of the present invention in which an optical sensor according to the present invention is applied to a linear image sensor. FIG. 3 shows one element of a linear image sensor. In actual use, a plurality of elements of the identical structure are aligned laterally. (for example, 1728 elements in space of A4 in size, 216 mm in length, and 8 dots/mm) An optical sensor 3000 according to the present invention is illustrated as a TFT and a current source. A gate of the optical sensor 3000 is coupled with a drain and also with a bias 3007. Application of bias voltage to the bias 3007 sets the TFT to the ON state, simultaneously applying voltage to the drain.

Holding capacity 3002 for holding electrical charges produced by photo carriers collected into a source may be separately provided or may be substituted by TFT parasitic capacity. In the present embodiment, the holding capacity is separately disposed. A switch TFT 3001 is used as a switch to transfer electrical charges accumulated in the holding capacity to capacity 3003. The gate of the switch TFT 3001 is coupled with a shift resistor for sequential application of a voltage to the shift resistor in synchronization with a clock.

Electrical charges in the capacity 3003 are output into an output 3006 as electrical signals through an amplifier 3005. A reset TFT 3004 is disposed between the capacity 3003 and a ground for resetting the capacitor 3003.

Embodiment 9

Figure 4:
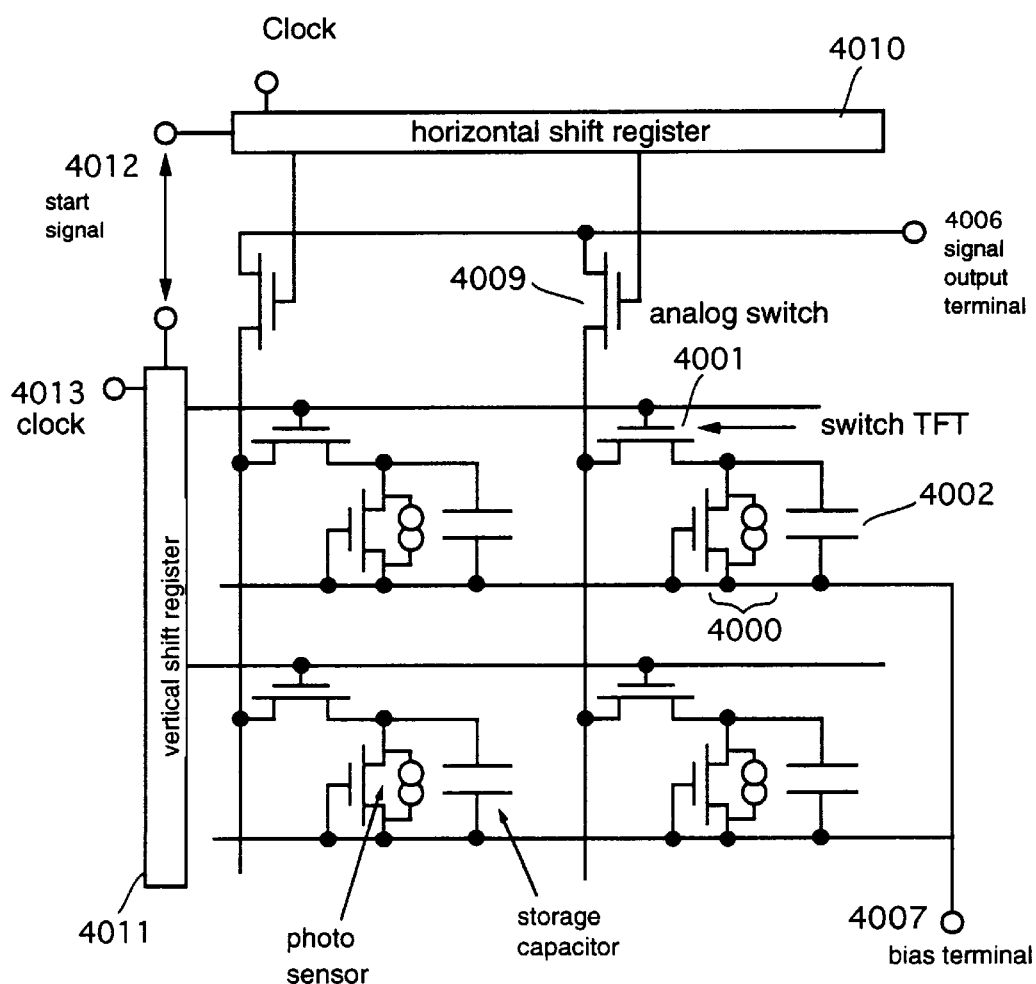
FIG. 4 shows a circuit structure when the present invention is applied to an area image sensor.

FIG. 4 shows a ninth embodiment of the present invention in which an optical sensor according to the present invention is applied to an area sensor. An optical sensor 4000 is illustrated as a TFT and a current source. A TFT gate is coupled with a drain and also with a bias 4007. Application of bias voltage to the bias 4007 sets the TFT to the ON state, simultaneously applying voltage to the drain.

Holding capacity 4002 for holding electrical charges produced by photo carriers collected into a source may be separately disposed or may be substituted by TFT parasitic capacity. Providing the capacity separately is more preferable. A switch TFT 4001 is used as a switch to transfer electrical charges accumulated in the holding capacity to capacity 4002. The gate of the switch TFT 4001 is coupled with a vertical shift resistor 4011, and the source or drain is coupled with a horizontal shift resistor 4010 through an analog switch 4009. A voltage is sequentially applied to each shift resistor in synchronization with a clock.

Signals transmitted through the analog switch 4009 are output into an output 4006. For a scanning method, an optical signal in the first column is output by sequentially applying a voltage to the horizontal shift resistor from the first to the last column while applying a voltage to the first row of the vertical shift resistor. Next, an optical signal in the second column is output by sequentially applying a voltage to the horizontal shift resistor from the first to the last column while applying a voltage to the second row of the vertical shift resistor. Repeating this process until the last row of the vertical shift resistor is applied with a voltage completes sensing of one screen.

As described in the above, implementation of an entirely novel type of an optical sensor according to the present invention is made possible by skillfully combining a polycrystal silicon TFT and an amorphous silicon layer to output photo carriers produced in the amorphous silicon layer as electrical signals by using the polycrystal silicon TFT with high mobility.

The polycrystal silicon TFT channel includes a high level of mobility and dispersion coefficient, resulting in a greater photocurrent by drifting of photo carriers at faster speed once the carriers reach the channel. In addition, a depletion layer formed in a drain extends further to the inside of the amorphous silicon layer, allowing photo carriers produced therein to be instantaneously collected into the channel.

In the present invention, a structure to use both light irradiated into the amorphous silicon layer and light irradiated directly into the polycrystal silicon is possible, and an optical sensor that is highly sensitive to all the light in the visible radiation range from shorter wavelength to longer wavelengths. The present invention comprises amorphous silicon for use as light absorption material. Needless to say, it is not the only material available to serve the purpose. The material selected from amorphous silicon, cadmium sulfide, cadmium selenium, and amorphous silicon germanium may also be used.

What is claimed is:

1. An optical sensor, comprising:
   a gate electrode over a substrate; and
   a polycrystal semiconductor layer comprising silicon formed over said gate electrode with a gate insulating film interposed therebetween, and
   an amorphous semiconductor layer formed in contact with said polycrystal semiconductor layer.

2. An optical sensor, comprising:
   a gate electrode over a substrate; and
   a polycrystal semiconductor layer comprising silicon formed over said gate electrode with a gate insulating film interposed therebetween, said polycrystal semiconductor layer including a source region, a drain region, and a channel forming region,
   wherein an amorphous semiconductor layer is formed in contact with at least said channel forming region and said drain region.

3. An optical sensor, comprising:
   a gate electrode over a substrate;

a polycrystal semiconductor layer comprising silicon formed over said gate electrode with a gate insulating film interposed therebetween;

an amorphous semiconductor layer formed in contact with said polycrystal semiconductor layer; and a transparent conductive layer formed on said amorphous semiconductor layer.

4. An optical sensor, comprising:

a gate electrode over a substrate;

a polycrystal semiconductor layer comprising silicon formed over said gate electrode with a gate insulating film interposed therebetween;

an amorphous semiconductor layer formed in contact with said polycrystal semiconductor layer; and a transparent insulating layer formed on said amorphous semiconductor layer.

5. An optical sensor, comprising:

a gate electrode over a substrate;

a polycrystal semiconductor layer comprising silicon formed over said gate electrode with a gate insulating film interposed therebetween, said polycrystal semiconductor layer including a source region, a drain region, and a channel forming region, wherein an amorphous semiconductor layer is formed in contact with at least said channel forming region and said drain region, and wherein a conductive layer with optical transmission properties for visible light is formed on said amorphous semiconductor layer.

6. An optical sensor, comprising:

a gate electrode over a substrate;

a polycrystal semiconductor layer comprising silicon formed over said gate electrode with a gate insulating film interposed therebetween, said polycrystal semiconductor layer including a source region, a drain region, and a channel forming region, wherein an amorphous semiconductor layer is formed in contact with at least said channel forming region and said drain region, and wherein an insulating layer with translucent properties for visible light is formed on said amorphous semiconductor layer.

7. The optical sensor according to claim 2, 5 or 6, wherein said amorphous semiconductor layer covers an entire surface of said channel forming region.

8. The optical sensor according to claim 2, 5 or 6, wherein said amorphous semiconductor layer covers a part of said channel forming region to expose another part of the channel forming region therefrom.

9. The optical sensor according to claim 3 or 5, wherein said conductive layer is electrically connected to said drain region.

10. The optical sensor according to any one of claims 1 to 6, wherein said optical sensor comprises a linear image sensor.

11. The optical sensor according to any one of claims 1 to 6, wherein said optical sensor comprises an area image sensor.

12. The optical sensor according to any one of claims 1 to 6, wherein said amorphous semiconductor layer comprises SiGe.

* * * * *